US011973004B2

United States Patent
Cao et al.

(10) Patent No.: US 11,973,004 B2
(45) Date of Patent: Apr. 30, 2024

(54) MECHANICAL ARCHITECTURE FOR A MULTI-CHIP MODULE

(71) Applicant: Tesla, Inc., Austin, TX (US)

(72) Inventors: Robert Yinan Cao, San Francisco, CA (US); Mitchell Heschke, Los Altos Hills, CA (US); Mengzhi Pang, Cupertino, CA (US); Shishuang Sun, Cupertino, CA (US); Vijaykumar Krithivasan, San Jose, CA (US)

(73) Assignee: Tesla, Inc., Austin, TX (US)

(*) Notice: Subject to any disclaimer, the term of this patent is extended or adjusted under 35 U.S.C. 154(b) by 433 days.

(21) Appl. No.: 17/277,893

(22) PCT Filed: Sep. 19, 2019

(86) PCT No.: PCT/US2019/051956
§ 371 (c)(1),
(2) Date: Mar. 19, 2021

(87) PCT Pub. No.: WO2020/061330
PCT Pub. Date: Mar. 26, 2020

(65) Prior Publication Data
US 2021/0351104 A1 Nov. 11, 2021

Related U.S. Application Data

(60) Provisional application No. 62/733,559, filed on Sep. 19, 2018.

(51) Int. Cl.
*H01L 23/40* (2006.01)
*H01L 23/498* (2006.01)
(Continued)

(52) U.S. Cl.
CPC .... *H01L 23/4006* (2013.01); *H01L 23/49822* (2013.01); *H01L 23/49838* (2013.01);
(Continued)

(58) Field of Classification Search
CPC ........... H01L 23/4006; H01L 23/49822; H01L 23/49838; H01L 25/0652; H01L 25/50; H01L 2023/4081; H01L 2023/4087
(Continued)

(56) References Cited

U.S. PATENT DOCUMENTS 5,703,753 A 12/1997 Mok
2002/0115313 A1 8/2002 Chung et al.
(Continued)

FOREIGN PATENT DOCUMENTS

| CN | 1130958 | 9/1996 |
|---|---|---|
| CN | 1902751 | 1/2007 |
| WO | WO 11/034555 | 3/2011 |

OTHER PUBLICATIONS

Pal et al., Feb. 24, 2018, A case for packageless processors, 2018 IEEE International Symposium on High Performance Computer Architecture, pp. 466-479.
(Continued)

*Primary Examiner* — Quoc D Hoang
(74) *Attorney, Agent, or Firm* — Knobbe, Martens, Olson & Bear, LLP

(57) ABSTRACT

Described is a multi-chip module that may include a Redistribution Layer (RDL) substrate having Integrated Circuit (IC) dies mounted to a first surface of the RDL substrate. A second plurality of IC dies may be mounted to an opposite second surface. A plurality of sockets can be mounted upon the second plurality of IC dies and a cold plate then mounted to the first plurality of IC dies. The mounting structure may include socket frames coupled to the plurality of sockets.

9 Claims, 11 Drawing Sheets

(51) Int. Cl.
*H01L 25/00* (2006.01)
*H01L 25/065* (2023.01)

(52) U.S. Cl.
CPC .......... *H01L 25/0652* (2013.01); *H01L 25/50* (2013.01); *H01L 2023/4081* (2013.01); *H01L 2023/4087* (2013.01)

(58) Field of Classification Search
USPC ........................................................ 257/713
See application file for complete search history.

(56) References Cited

U.S. PATENT DOCUMENTS

| | | |
|---|---|---|
| 2002/0170748 A1 | 11/2002 | Larson |
| 2003/0000080 A1 | 1/2003 | Colbert et al. |
| 2003/0156400 A1* | 8/2003 | Dibene, II ......... H01R 12/7088 |
| | | 257/E23.09 |
| 2009/0296360 A1 | 12/2009 | Doblar et al. |
| 2012/0098116 A1 | 4/2012 | Casey et al. |

OTHER PUBLICATIONS

Yu, Sep. 15, 2014, New System-in-package (SiP) integration technologies, Proceedings of the IEEE 2014 Custom Integrated Circuits Conference, pp. 1-6.
International Search Report and Written Opinion dated Nov. 18, 2019 in PCT/US2019/051956.

* cited by examiner

MECHANICAL ARCHITECTURE FOR A MULTI-CHIP MODULE

CROSS-REFERENCE TO RELATED APPLICATIONS

This application is filed under 35 U.S.C. § 371 as the U.S. National Phase of Application No. PCT/US2019/051956 entitled "MECHANICAL ARCHITECTURE FOR A MULTI-CHIP MODULE" and filed Sep. 19, 2019, and which claims priority to U.S. Application No. 62/733,559 filed Sep. 19, 2018, each of which is incorporated by reference herein in its entirety.

BACKGROUND

Technical Field

The present invention relates generally to electronics, and more specifically to multi-chip modules.

Description of Related Art

Multi-chip computer systems are generally known to include a plurality of Integrated Circuits (IC) dies that are commonly packaged to support high performance processing systems. In some multi-chip modules, a plurality of ICs is mounted in an array with supporting interconnections and cooling systems. The structure of such multi-chip modules may include a plurality of components laminated into a number of layers with an Integrated Fan Out (InFO) substrate that provides signal connectivity between the plurality of ICs mounted thereto. While the InFO substrate provides efficiency for signal connectivity for the plurality of IC dies mounted thereon, it also has downsides for the Multi-Chip computer system that it services. Because the InFO substrate may have different temperature-based expansion characteristics than other components of the multi-chip module, when the temperature of the multi-chip module changes over time, the InFO substrate may warp, stretch, shrink or be damaged by the changing expansion of the substrate. Further, a large amount of heat removal from multi-chip modules using an InFO substrate can be difficult in some circumstances.

SUMMARY

One embodiment is a multi-chip module that includes: a Redistribution Layer (RDL) substrate; a first plurality of Integrated Circuit (IC) dies mounted to a first surface of the RDL substrate; a second plurality of IC dies mounted to an opposite second surface; a plurality of sockets mounted upon the second plurality of IC dies; a cold plate mounted to the first plurality of IC dies; and a mounting structure. In this embodiment, the mounting structure may include: a plurality of socket frames coupled to the plurality of sockets; a plurality of holes formed through the RDL substrate; and a plurality of screws extending from the plurality of socket frames through the plurality of holes formed through the RDL substrate and screwed into the cold plate.

Another embodiment is a method of mounting a multi-chip module to a substrate. The method may include mounting a plurality of integrated circuit dies onto a first surface of a redistribution layer; encapsulating the mounted integrated circuit dies; attaching a floating frames or molded socket, or both onto the intergrated circuit on the redistribution layer; mounting a thermal interface module onto the encapsulated IC dies; and installing a cold plate onto the thermal interface module.

DETAILED DESCRIPTION

Embodiments of the invention relate to a multi-chip module that can be mounted to a redistribution layer or InFO package. In one embodiment, the multi-chip module includes a modular direct-clamp structure that allows for mounting a plurality of ICs or sockets to be mounted onto and mechanically coupled to a cold plate to thermally cool the chips in the multi-chip module. In one embodiment, the ICs or sockets are mounted on an opposite side of the InFO substrate from the cold plate.

The mounting of the multi-chip module to the InFO substrate and/or cold plate may use a frame configured to hold a plurality of chips. For example, the frame may be sized and shaped to hold 2, 4, 6, 8, 10, 12 or more chips as described in more detail below. In this embodiment, the frame is rectangular or square to surround each side of the chip and provide a stable mounting system or means for the multi-chip module. At each corner of a chip within the module may be a through hold in the frame to allow a mounting pin, screw or other fastener to mount the frame to the substrate and cooling plate. As shown in the figures, one or more corner clamps may be used to fasten the multi-chip module frame to the rest of the package.

Figure 1:
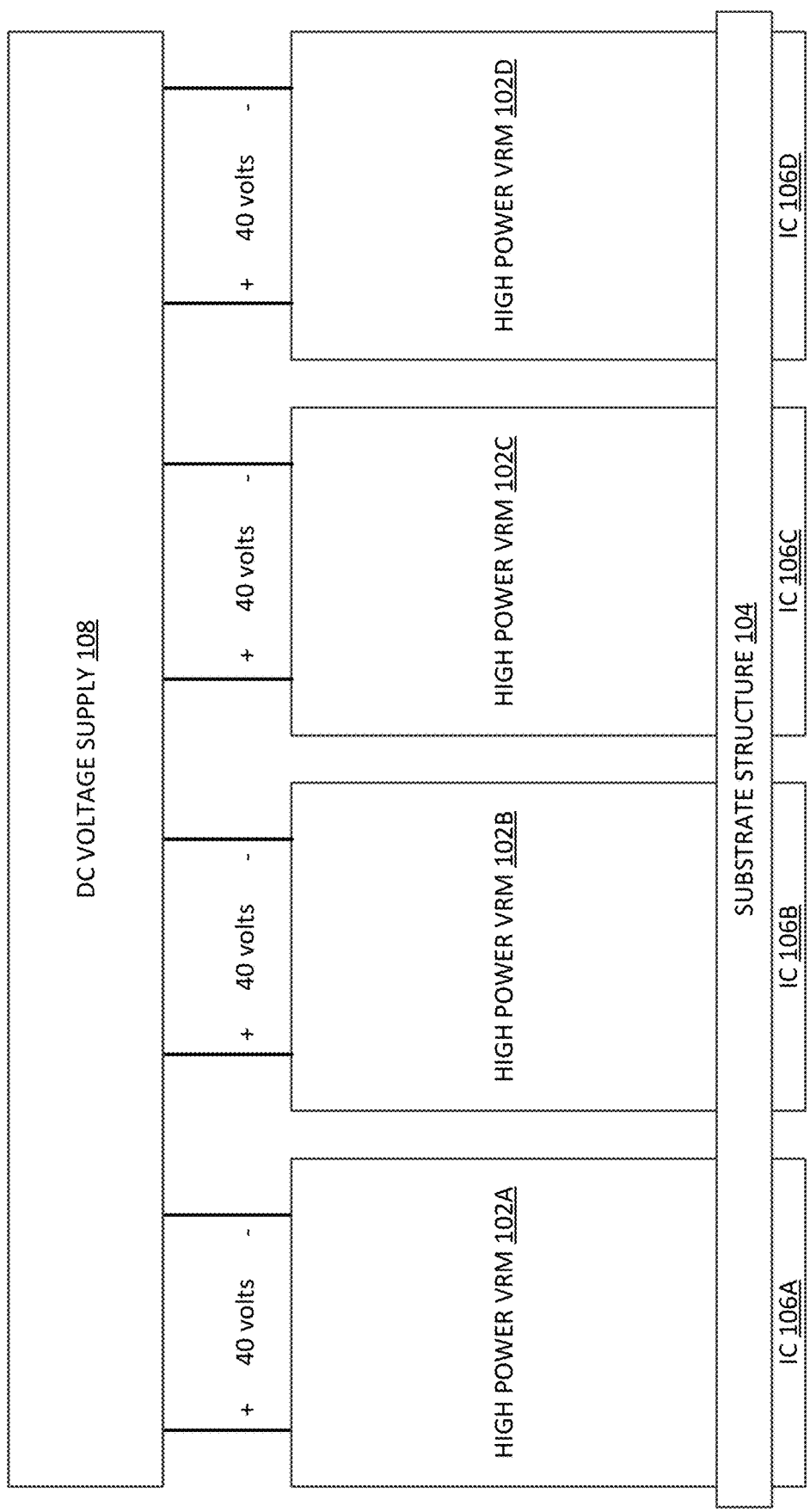
FIG. 1 is a sectional side view block diagram illustrating one embodiment of a multi-chip module constructed according to the present disclosure.

FIG. 1 is a sectional side view illustrating a multi-chip module 100 constructed according to the present disclosure. The multi-chip module 100 of FIG. 1 includes a plurality of high power Voltage Regulator Modules (VRMs) 102A, 102B, 102C, and 102D that mount on a substrate structure 104. The plurality of high power VRMs 102A, 102B, 102C, and 102D are fed by a DC supply voltage 108, e.g., 40 volts, 48 volts, or another relatively voltage, and respectively service a respective plurality of Integrated Circuits (IC) dies 106A, 106B, 106C, and 106D. In some embodiments, each of the plurality of high power VRMs 102A, 102B, 102C, and 102D produces an output of approximately 0.8 volts and provides 600 watts of power or more to the respective plurality of IC dies 106A, 106B, 106C, and 106D. Thus, each of the plurality of multiple circuit board high power VRMs 102A, 102B, 102C, and 102) produces in excess of 100 amperes of current to the plurality of IC dies 106A, 106B, 106C, and 106D.

Figure 2:
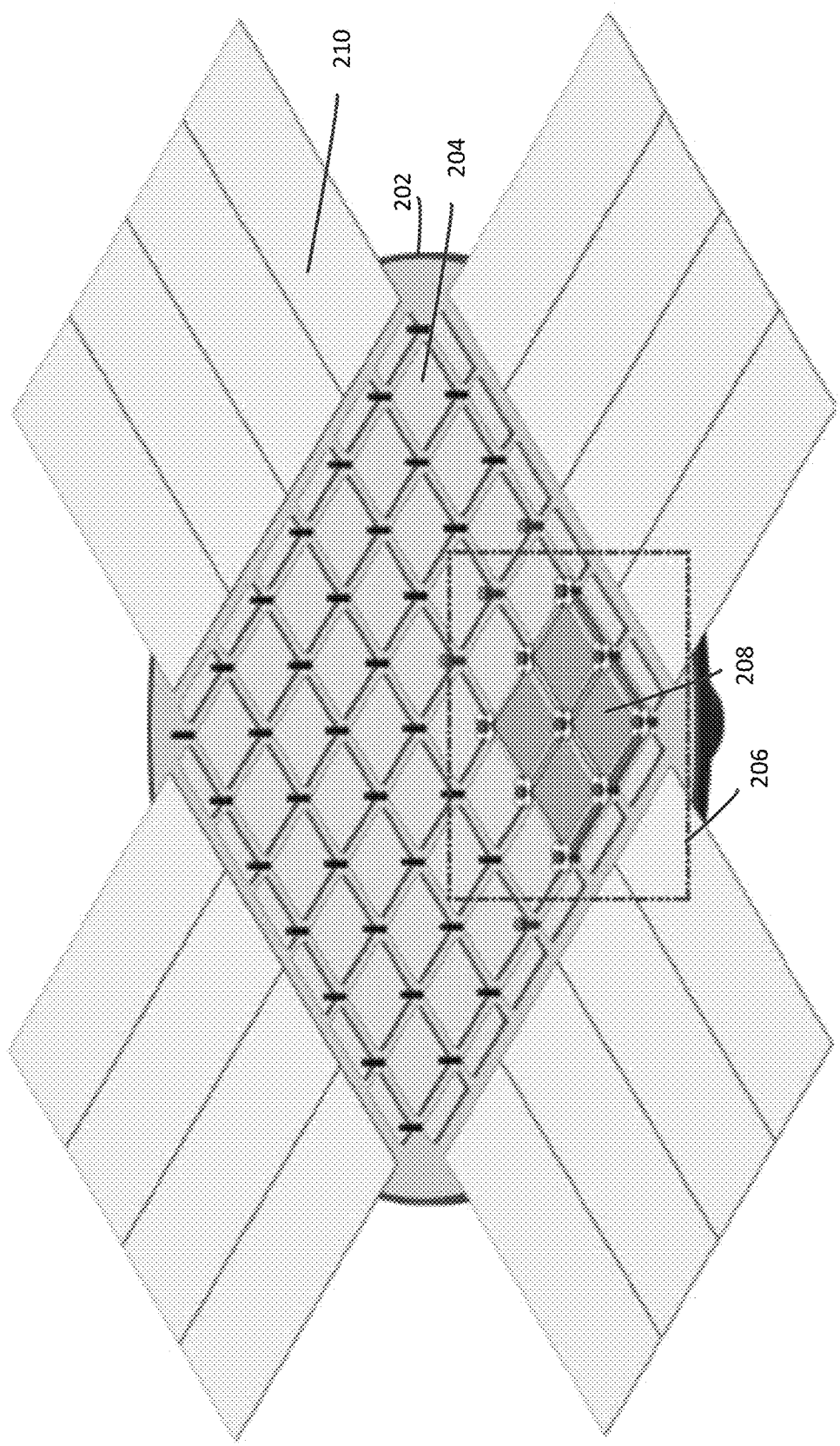
FIG. 2 is a perspective view of the multi-chip module of FIG. 1 according to an embodiment of the present disclosure.

FIG. 2 is a perspective view of a portion 200 of the multi-chip module of FIG. 1 according to an embodiment of the present disclosure. Illustrated is an Integrated Fan Out (InFO) substrate 202 upon which a plurality of embedded capacitor structures (embedded CAPs) 204 are mounted. The InFO substrate 202 may be formed in an integrated circuit manufacturing process and have a thickness of approximately 0.1 mm, although other thicknesses of InFO substrates are within the scope of the present disclosure. The InFO substrate 202 may be formed of silicon and include, for each of the embedded caps 204, signal routing connections between the embedded CAPs 204 and corresponding IC dies mounted on an opposite surface of the InFO substrate 202. As will be show in FIG. 3, according to one embodiment of the invention a modular direct-clamp structure 206 is shown for mounting a plurality of sockets 208 onto the embedded CAPs 204 such that the plurality of sockets 208 mechanically couple to a cold plate mounted on an opposite side of the InFO substrate 202.

Figure 3:
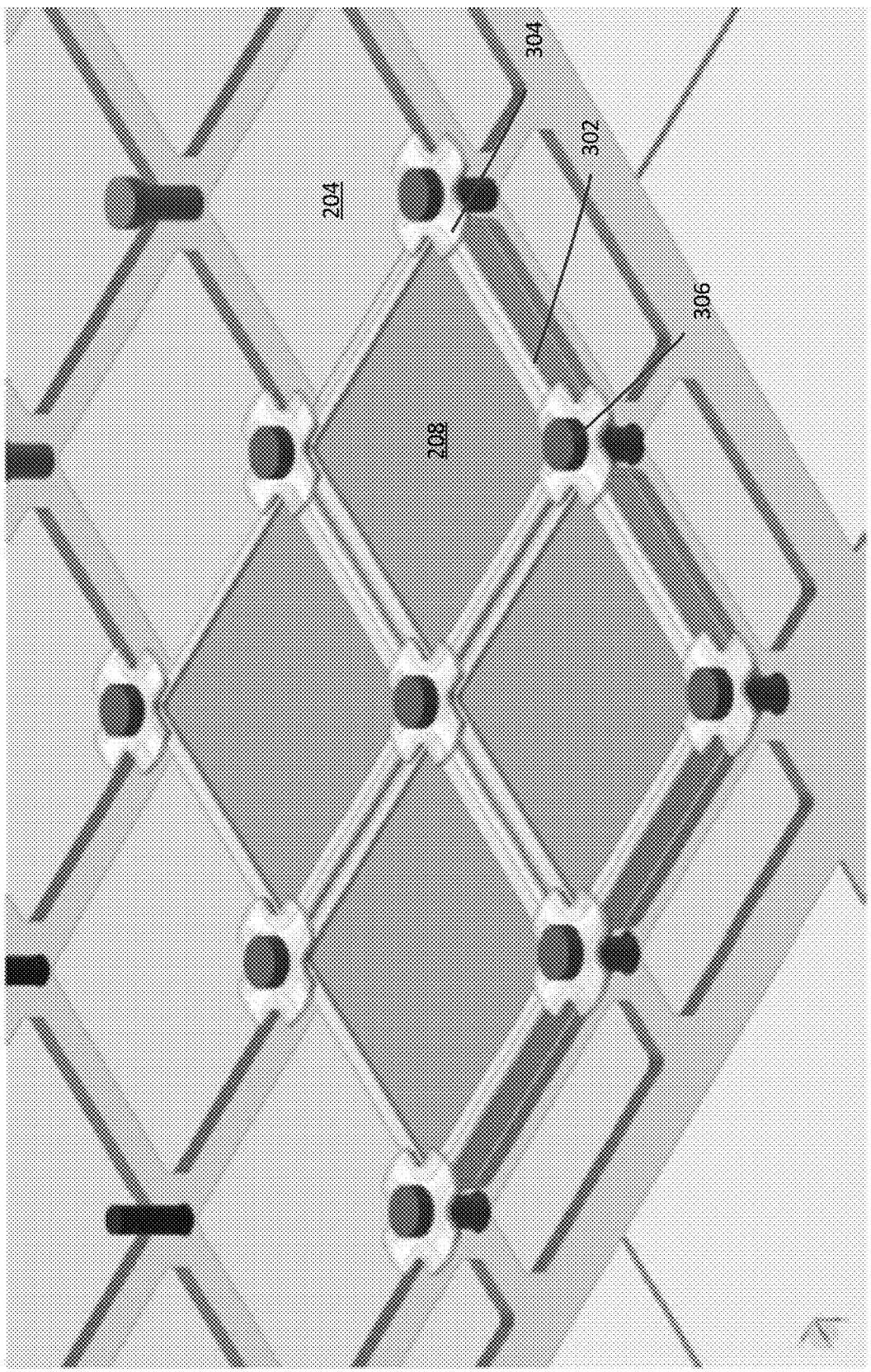
FIG. 3 is a partial perspective view of a magnified portion of the multi-chip module of FIG. 2.

FIG. 3 is a partial perspective view of a portion of the multi-chip module of FIG. 2. Shown in detail is one of the modular direct-clamp structures 206 that services the multi-chip module 100. The modular direct-clamp structure 206 includes a socket frame 302 that provides mechanical mounting for four sockets 208 mounted therein, corner clamps 304, and screws 306. The screws extend through the InFO substrate 202 and are secured within a cooling structure for the multi-chip module.

Figure 4:
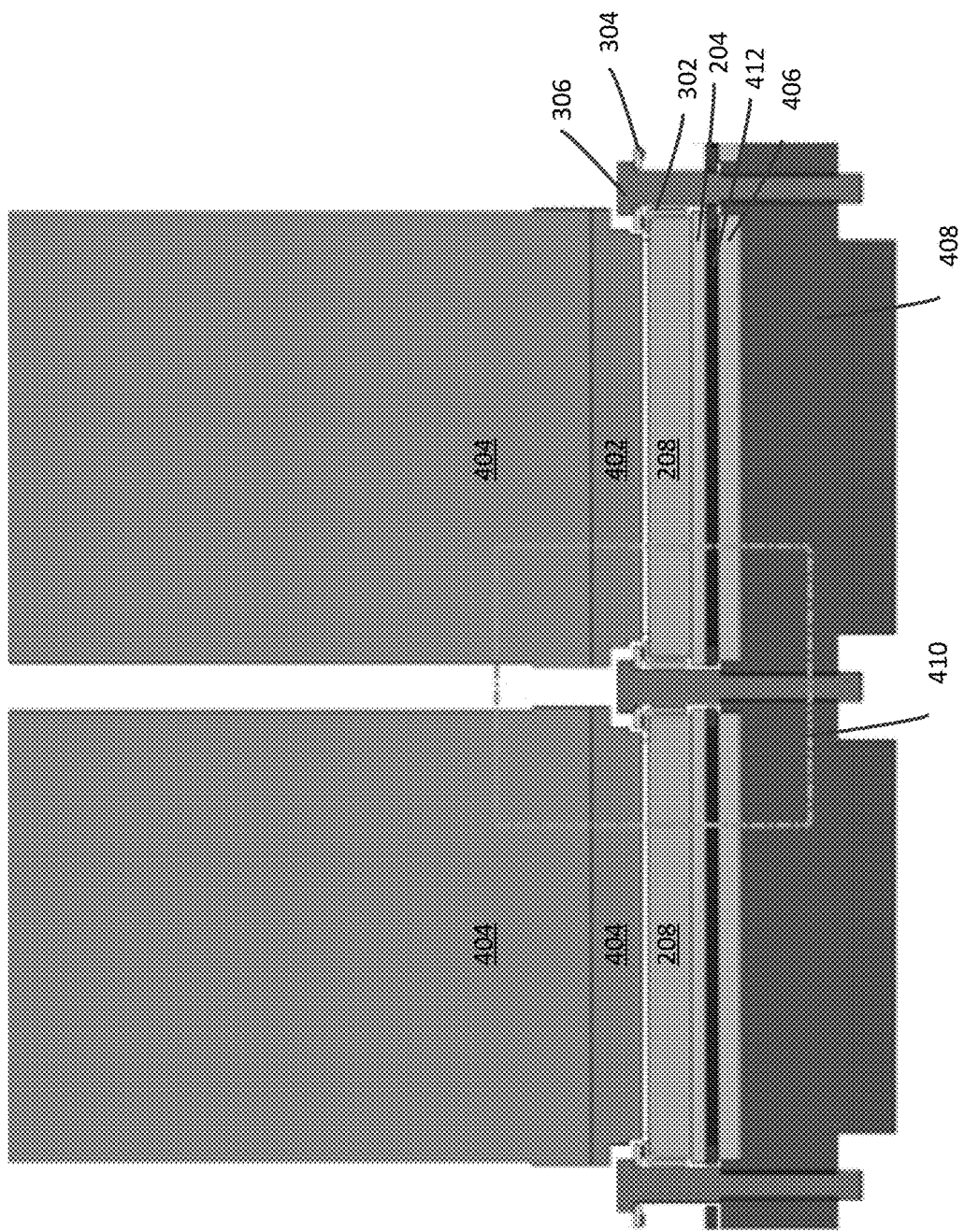
FIG. 4 is a sectional side view of the portion of the multi-chip module of FIG. 3.

FIG. 4 is a sectional side view of the portion of the multi-chip module of FIG. 3. The sectional side view of FIG. 4 shows in detail the modular clamp structure 206 and details of its mounting to the cooling structure. The cooling structure includes a cold plate 406 that mounts upon a global manifold structure 408. An IC die 412 mounts upon the InFO substrate 202. The screws 306 engage threads formed in the global manifold structure 408. Shown are plugs 402 that mount to the socket 208 and cases 404 mounted there upon. The cases 404 may house VRMs in some embodiments.

Figure 5:
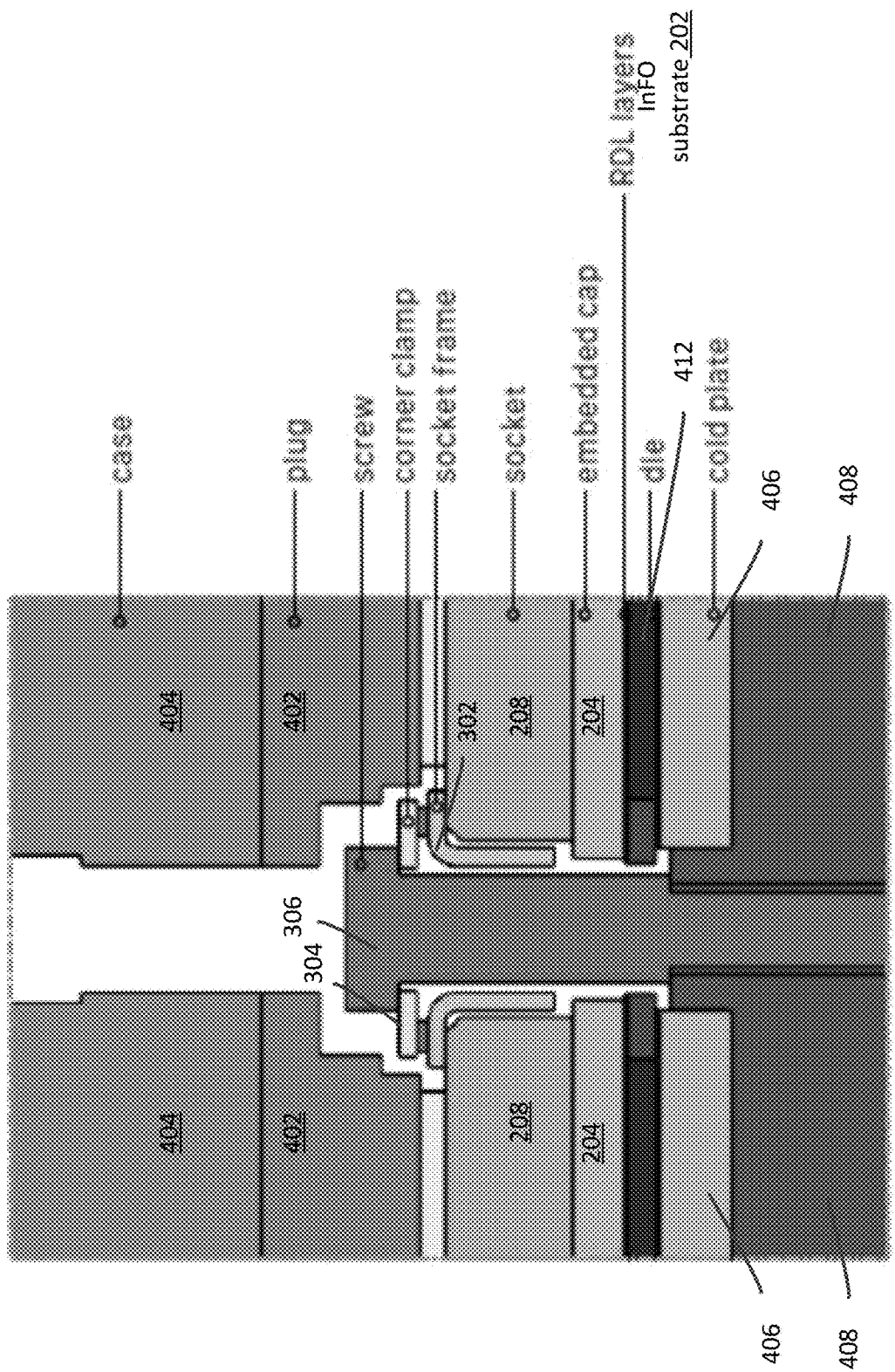
FIG. 5 is a sectional side view of the portion of the multi-chip module of FIG. 3 showing details of a load frame.

FIG. 5 is a sectional side view of the portion of the multi-chip module of FIG. 3 showing details of a load frame taken along section 410 of FIG. 4. FIG. 5 illustrates the components previously illustrated in FIG. 4 but with more detail. Note that the InFO substrate 202 provides one or more Redistribution Layers (RDLs) that service the interconnection between the IC dies 412 and the embedded CAPs 204. With the structure of FIG. 5, holes drilled through the InFO substrate 202 are shown. These holes may be formed mechanically or via lasering. The cold plate 406 (and the global manifold structure 408) serve as a structural back plate and provide sufficient stiffness for the InFO substrate 202 to ensure that the InFO substrate 202 will not be damaged due to uneven mechanical loads. The clamping structure provides the components mounted sufficient mobility to prevent cracking during thermal expansion and/or contraction.

Figure 6:
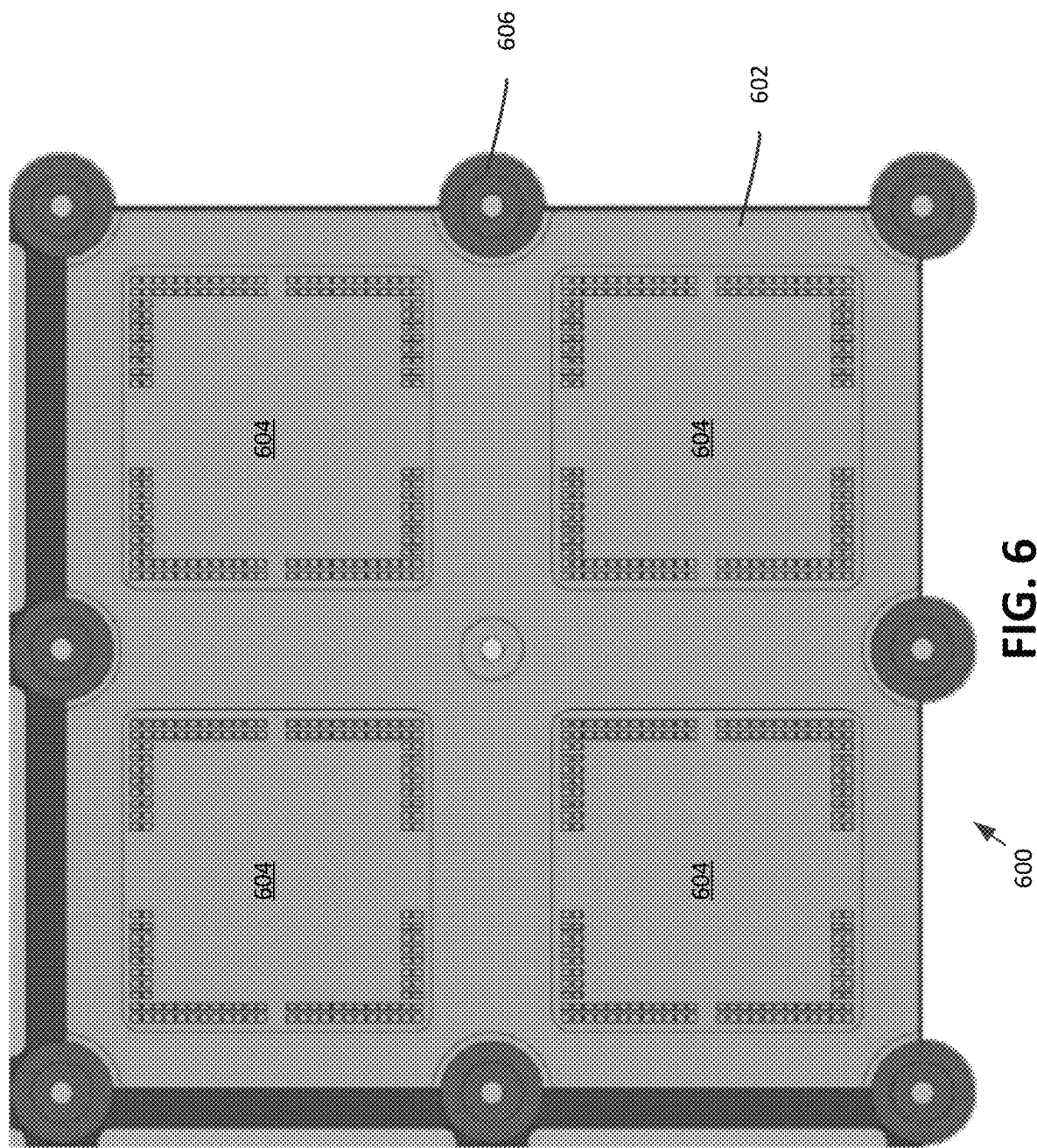
FIG. 6 is a top view of a socket of a multi-IC load frame of a multi-chip module according to an embodiment of the present disclosure.

FIG. 6 is a top view of a socket structure 600 of a multi-IC load frame of a multi-chip module according to an embodiment of the present disclosure. The socket structure 600 includes a load frame 602 having a plurality of sockets 604 formed/mounted therein. Screws/washers 606 secure the socket structure 600 to a cold plate. While four sockets 604 are shown in a 2×2 array any array of N×M of socket structures may be provided therewith, with N and M being integers.

Figure 7:
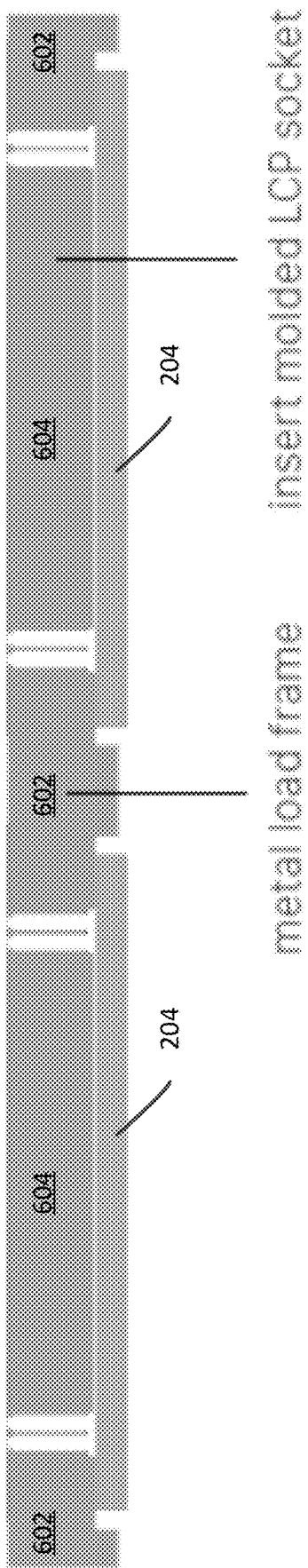
FIG. 7 is a sectional side view of the socket of the multi-IC load frame of FIG. 6.

FIG. 7 is a sectional side view of the socket of the multi-IC load frame of FIG. 6. Shown are insert molded LCP sockets 604 surrounded by a metal load frame 604, both of which couple to embedded caps 204.

Figure 8:
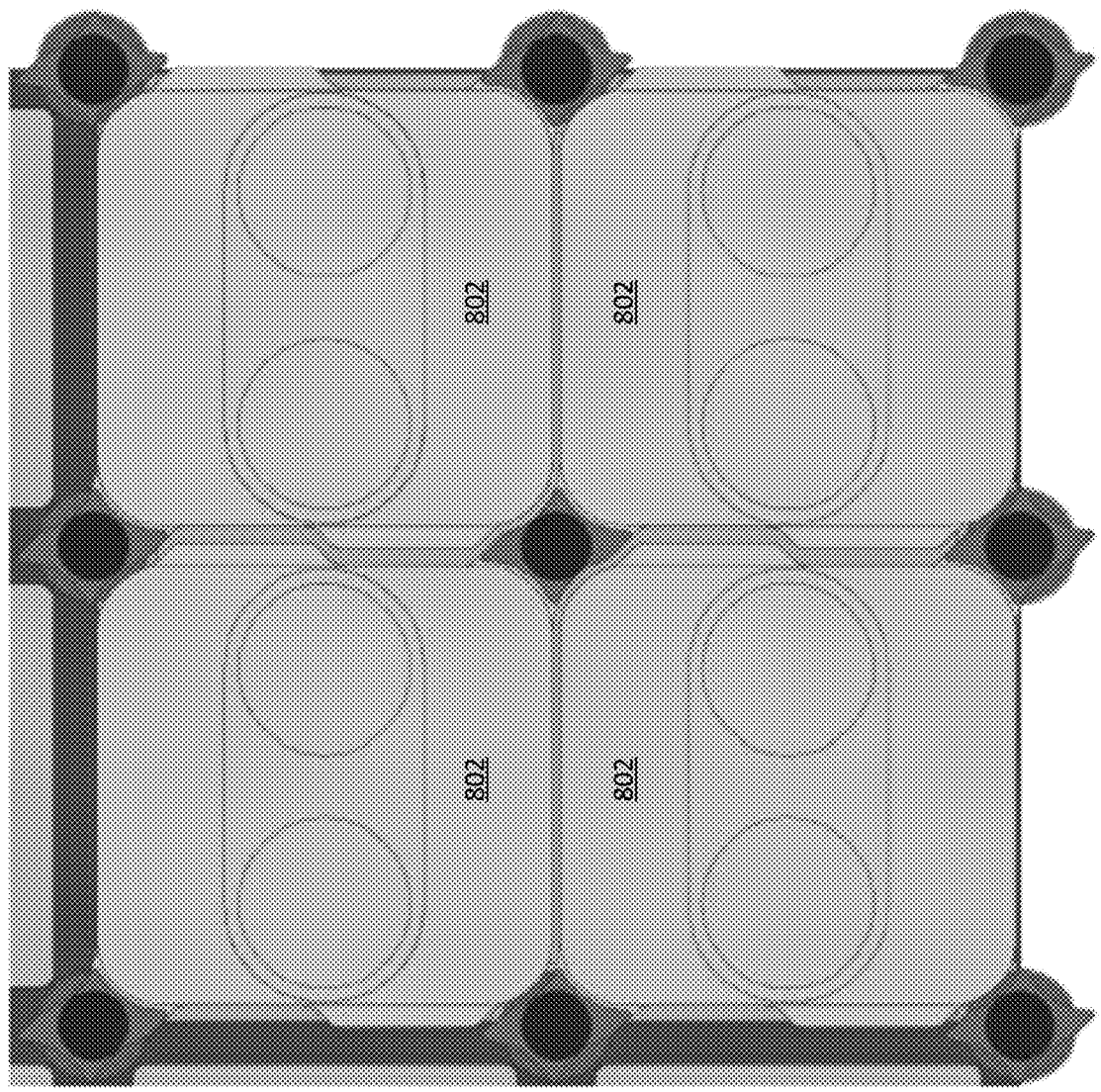
FIG. 8 is a top view of a Voltage Regulator Module (VRM) mounted into the socket structure of the multi-IC load frame of FIG. 6.

FIG. 8 is a top view Voltage Regulator Module (VRMs) mounted into the socket structure of the multi-IC load frame of FIG. 6. The VRMs 802 mount into the sockets 604 via appropriate electrical connections 804.

Figure 9:
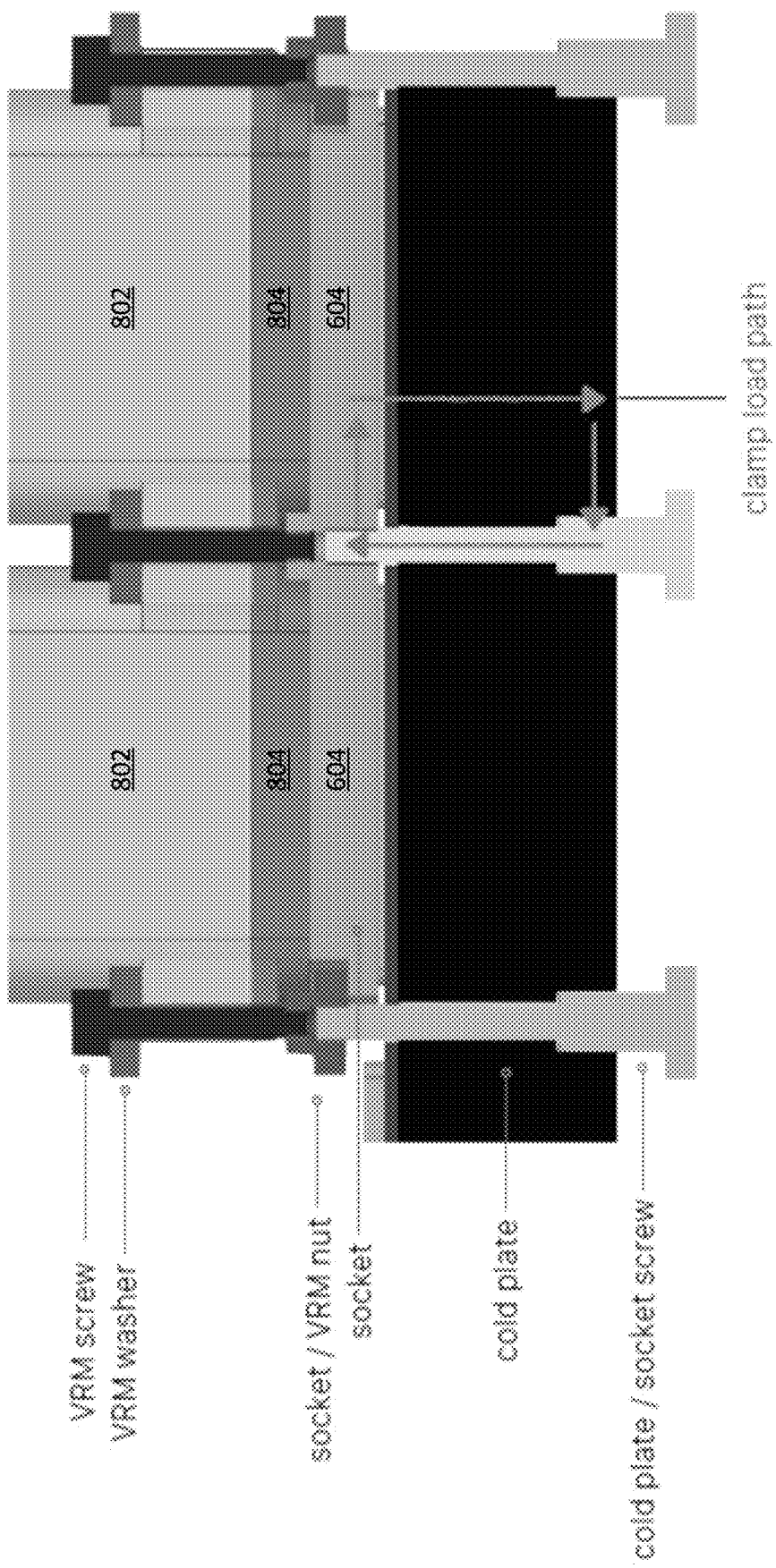
FIG. 9 is a partial sectional side view of the VRM and multi-IC load frame of FIG. 8.

FIG. 9 is a partial sectional side view of the VRM and multi-IC load frame of FIG. 8. The VRMs 802 mount upon the sockets 604 via the appropriate electrical connections 604. VRM screws and VRM washers couple to the cold plate via socket screws and a VRM nut/socket. Note that the complete structure is held vertically in place to the cold plate via this mounting structure.

Figure 10:
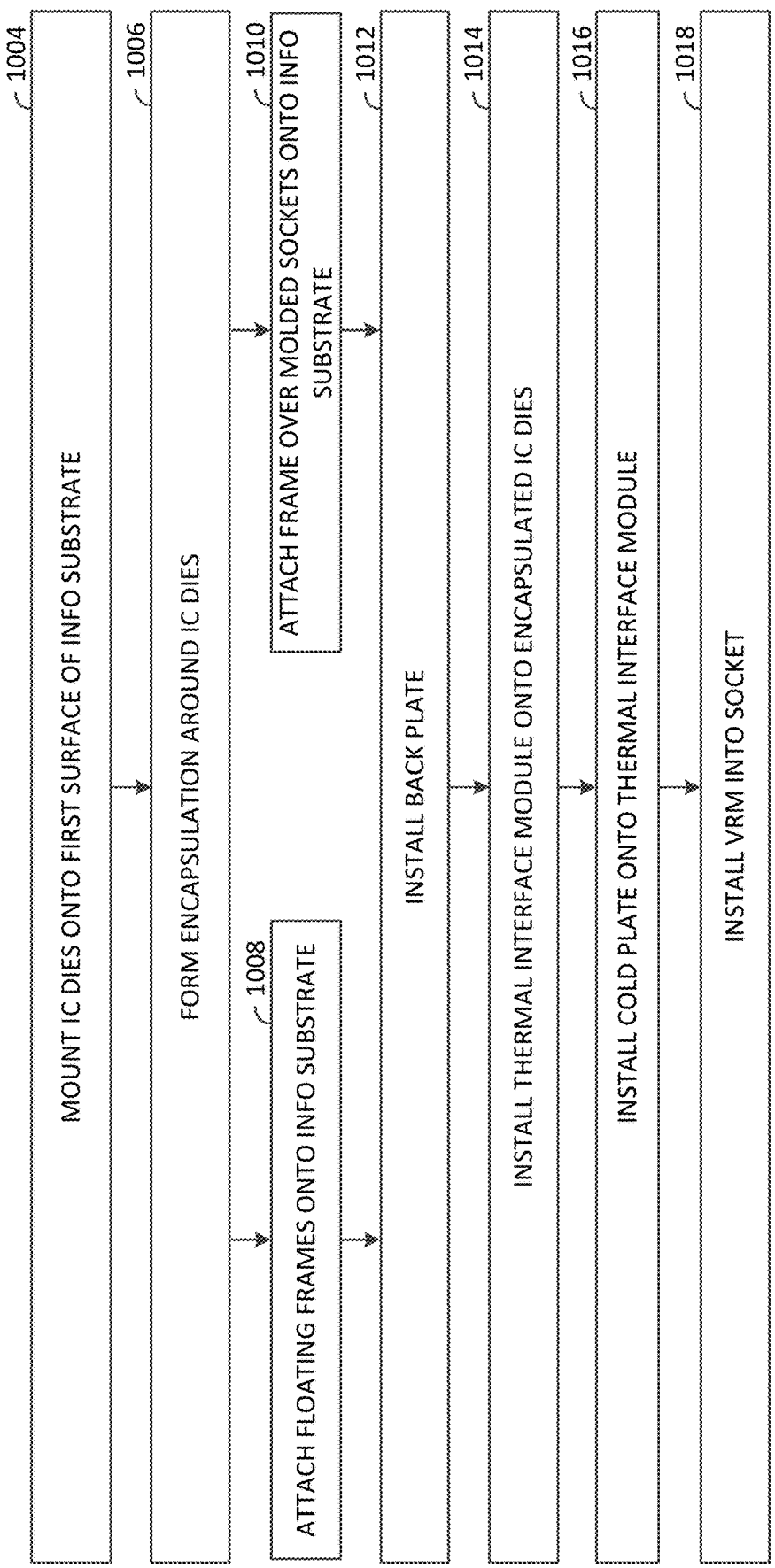
FIG. 10 is a flow chart illustrating a method for constructing a multi-chip module according to an embodiment of the present disclosure.

FIG. 10 is a flow chart illustrating a method for constructing a multi-chip module according to an embodiment of the present disclosure. The method 1000 begins with mounting a plurality of IC dies onto a first surface of an InFO substrate (step 1004). Then, the IC dies are encapsulated (step 1006). Then, two differing steps may be taken based upon an embodiment chosen. With a first embodiment, floating frames are attached to the InFO substrate (step 1008). With a second embodiment, frame over molded sockets are attached to the second surface of the InFO substrate (step 1010). Then, a back plate is installed (step 1012). Next, a thermal interface module is installed onto the encapsulated IC dies (step 1014). Then, a cold plate is installed onto the thermal interface module (step 1016). Finally, the VRM modules are installed into the sockets (step 1018). Drilling of holes into the laminated structure, tapping the holes, securing the sockets with screws, and securing the VRM modules may be performed at various points during the method 1000.

Figure 11:
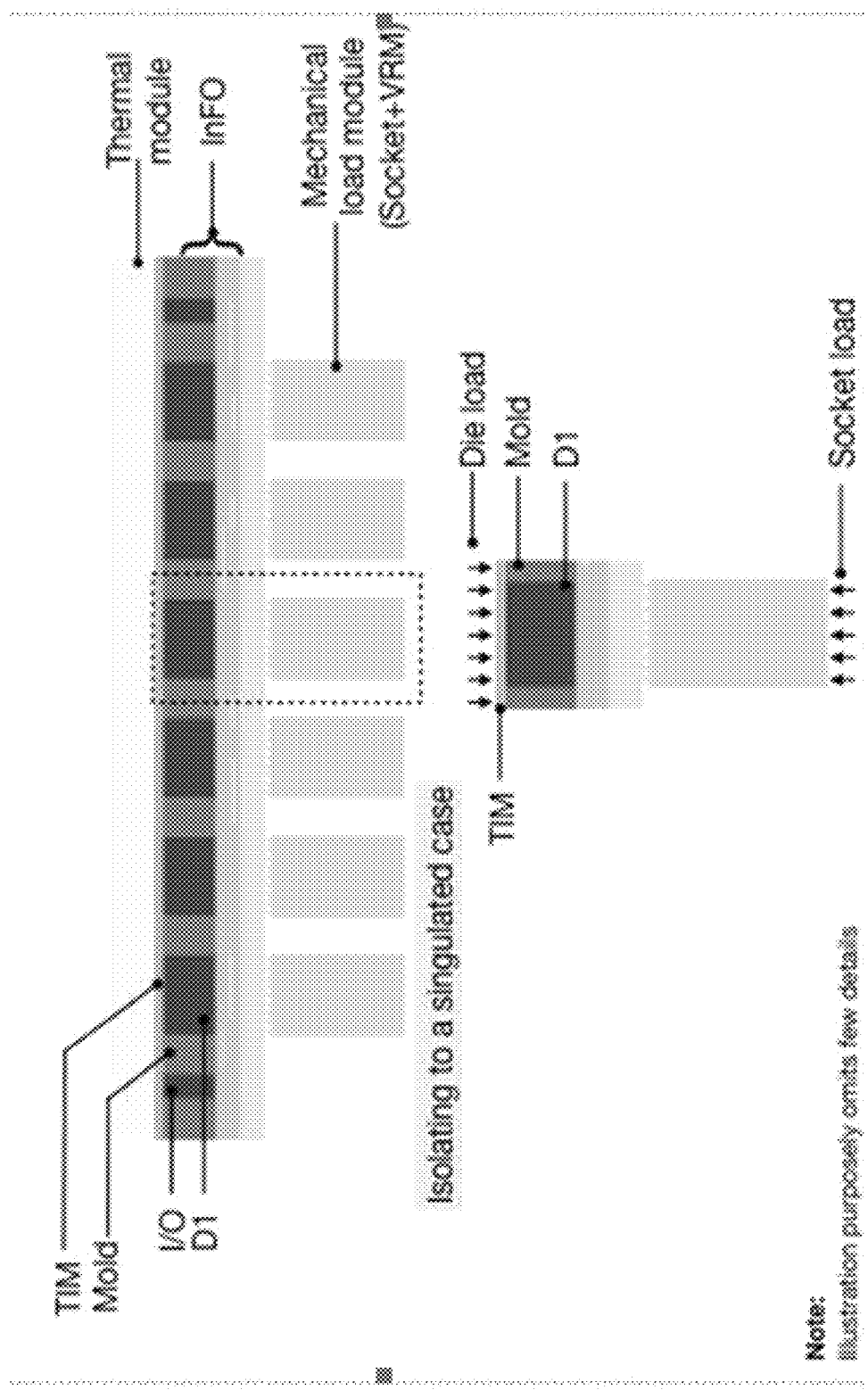
FIG. 11 is a partial sectional side view illustrating a multi-chip module according to another embodiment of the present disclosure.

FIG. 11 is a partial sectional side view illustrating a multi-chip module according to another embodiment of the present disclosure. The structure of FIG. 11 may be accomplished using the method 1000 of FIG. 10.

The system and methods above has been described in general terms as an aid to understanding details of preferred embodiments of the present invention. Other preferred embodiments of the present include the described application for electric vehicles. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

We claim:

1. A multi-chip module comprising:
    a Redistribution Layer (RDL) substrate;
    a first plurality of Integrated Circuit (IC) dies mounted to a first surface of the RDL substrate;
    a second plurality of IC dies mounted to an opposite second surface;
    a plurality of sockets mounted upon the second plurality of IC dies;
    a cold plate mounted to the first plurality of IC dies; and
    a mounting structure comprising:
        a plurality of socket frames coupled to the plurality of sockets;
        a plurality of holes formed through the RDL substrate;
        a plurality of screws extending from the plurality of socket frames through the plurality of holes formed through the RDL substrate and screwed into the cold plate.

2. The multi-chip module of claim 1, wherein the RDL substrate is formed in a semi-conductor manufacturing process.

3. The multi-chip module of claim 1, wherein each socket frame of the plurality of socket frames services a single socket.

4. The multi-chip module of claim 1, wherein each socket frame of the plurality of socket frames services at least two sockets.

5. The multi-chip module of claim 1, further comprising a plurality of Voltage Regulator Modules (VRMs) mounted into the plurality of sockets.

6. The multi-chip module of claim 1, wherein the second IC dies comprise embedded capacitor arrays.

7. A method of mounting a multi-chip module to a substrate, comprising:
    mounting a plurality of integrated circuit dies onto a first surface of a redistribution layer;
    encapsulating the mounted integrated circuit dies;
    attaching a floating frames or molded socket, or both onto an integrated circuit on the redistribution layer;
    mounting a thermal interface module onto the encapsulated IC dies; and
    installing a cold plate directly onto the thermal interface module.

8. The method of claim 7, further comprising securing the sockets to the substrate with screws.

9. The method of claim 7, further comprising adding voltage regulator modules onto the substrate.

* * * * *